United States Patent [19]

Borner

[11] 3,999,153
[45] Dec. 21, 1976

[54] ACOUSTIC SURFACE WAVE FILTER

[75] Inventor: Manfred Börner, Ulm, Germany

[73] Assignee: Licentia Patent-Verwaltungs-G.m.b.H., Frankfurt am Main, Germany

[22] Filed: July 22, 1975

[21] Appl. No.: 598,023

[30] Foreign Application Priority Data

July 25, 1974 Germany ............................ 2435751

[52] U.S. Cl. .................................. 333/72; 310/9.8; 333/30 R
[51] Int. Cl.² ..................... H03H 9/26; H03H 9/32; H03H 9/02; H01L 41/10
[58] Field of Search ............... 333/30 R, 72; 310/8, 310/8.1, 9.8, 8.2

[56] References Cited

UNITED STATES PATENTS

| 3,836,876 | 9/1974 | Marshall et al. | 333/30 R |
| 3,882,430 | 5/1975 | Maerfeld | 333/30 R |
| 3,883,831 | 5/1975 | Williamson et al. | 333/30 R |
| 3,886,504 | 5/1975 | Hartmann et al. | 333/72 |

Primary Examiner—Eli Lieberman
Assistant Examiner—Marvin Nussbaum
Attorney, Agent, or Firm—Spencer & Kaye

[57] ABSTRACT

An acoustic surface wave filter comprises a member stimulable to surface oscillations with means for converting electrical energy into mechanical energy and vice versa associated therewith and a plurality of disturbance locations on a surface of the member in the form of a line grating with variable spacing between adjacent lines in the longitudinal direction of the lines.

9 Claims, 7 Drawing Figures

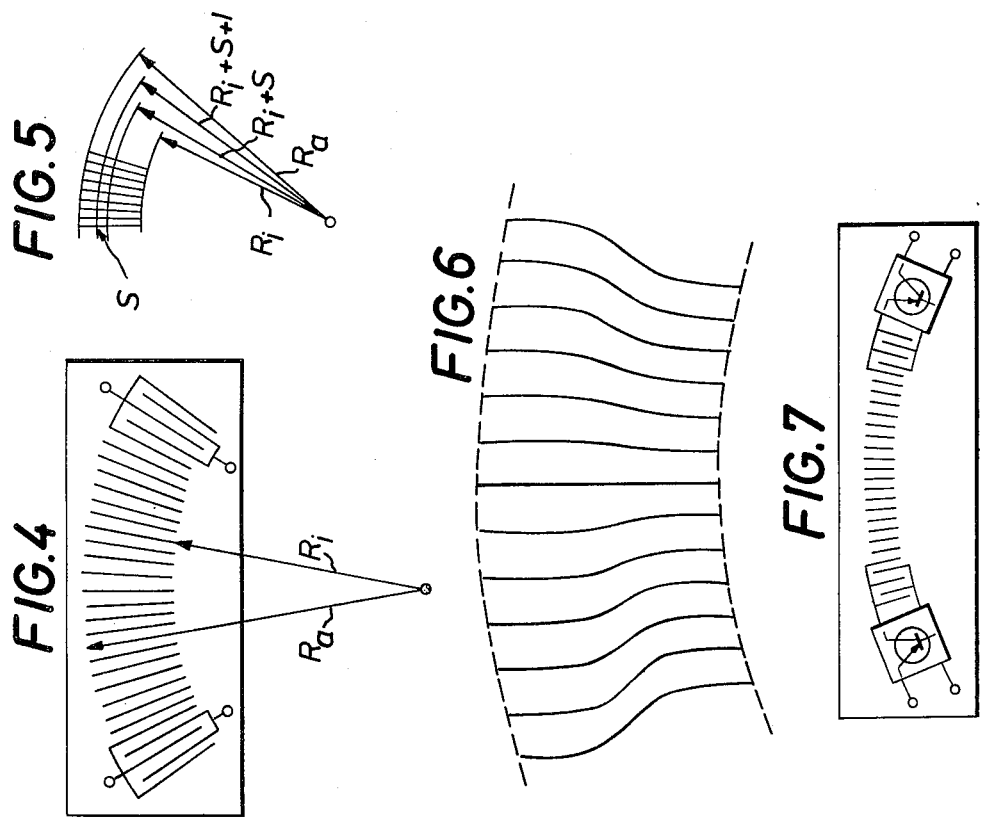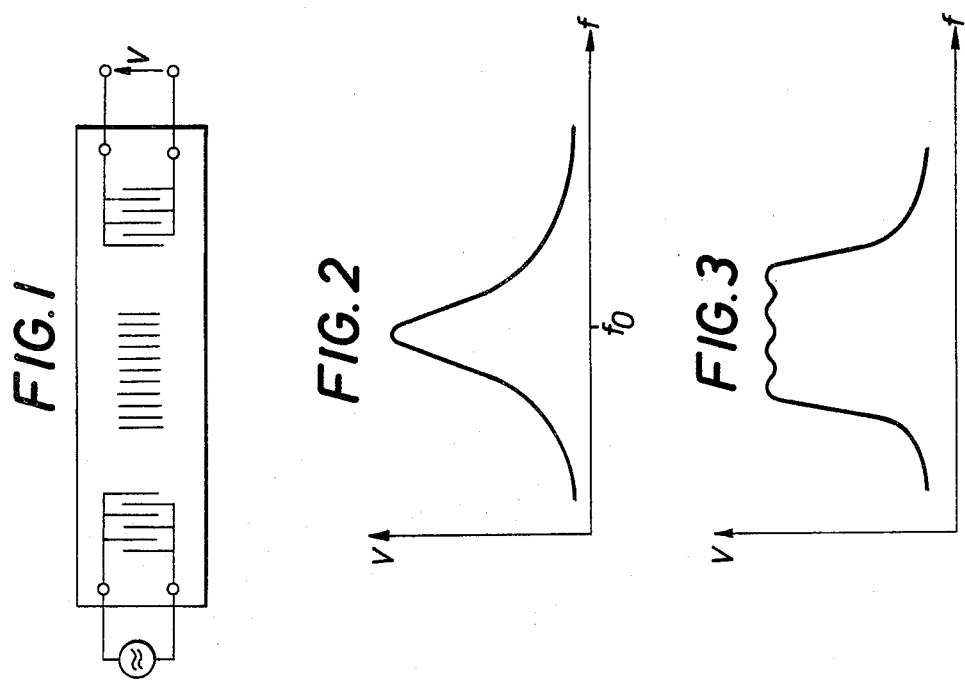

ACOUSTIC SURFACE WAVE FILTER

BACKGROUND OF THE INVENTION

The invention relates to an acoustic surface wave filter comprising at least one member which can be stimulated to surface oscillations and is made at least partly of piezoelectric material, the surface on at least one side of the member being provided with disturbance locations (possibly impurity locations) for surface waves, the filter also comprising means for converting electrical into mechanical energy and vice versa, at least some of the disturbance locations being combined into a resonator in the form of a ruled or line grating and the average distance between the disturbance locations in the resonator being equal to half the wave-length of the surface waves or an integral multiple thereof.

The transmission behaviour of acoustic surface wave filters is such that, without weighting the dimensions of the transducer fingers, the attenuation frequency varies approximately in accordance with (sin $x/x)^2$, $x$ being a linear function of the frequency. This transmission behaviour is similar, with regard to flank steepness, to that of a three-circuit band-pass filter. There are known methods of influencing this behaviour, either by weighting the geometry of the transducer fingers or by producing coupled resonance structures in the path travelled by the surface wave, so that the filter slopes are made steeper, like those of a multi-circuit band-pass filter. The disadvantage of this method is that accurate photo-etching is required to prevent diffraction effects.

Coupled resonance structures, which can likewise be used to improve the flank steepness, are described in German Offenlegungsschrift No. 2,133,634 published July 6, 1971. These resonance structures comprise disturbance locations disposed perpendicular to the propagation direction of the surface waves, the distance between adjacent spots being chosen so as to produce a resonator in conjunction with the intermediate portions of surface. As before, however, these structures have to be manufactured very accurately, since the accuracy with which the resonance frequency of a resonator can be tuned depends on the accuracy with which two adjacent disturbance locations satisfy the condition $\lambda/2$.

German Offenlegungsschrift No. 2,363,701 published June 26, 1975 describes an acoustic surface wave filter characterised by good flank steepness and adapted for making wide variations in the intensity of the proportion of oscillations transmitted by the filter. To this end, according to the last-mentioned specification, at least some of the disturbance locations are combined into a resonator in the form of a ruled grating and the average distance between disturbance locations is made equal to half the wave-length of the surface waves or to an integral multiple thereof.

As a result of the combined effect of many weak reflections on the grating lines, a standing wave distribution builds up for frequencies at which the distance between adjacent lines of the grating is $\lambda/2$ or an integral multiple thereof. In one form of grating of this kind, it is stimulated at its input, for example, at a short interdigital line, with a constant a.c. voltage, and at its output, for example, an interdigital line, it delivers a voltage U which varies in accordance with a resonance curve which exhibits a relatively narrow peak.

A complete ruled or line grating, therefore, has the properties of an individual resonator.

To obtain a filter having a wider pass-band, it is usual to couple a number of resonators together. Some advantageous methods of acoustically coupling resonators are described in detail in German Offenlegungsschrift No. 2,363,701.

SUMMARY OF THE INVENTION

An object of the invention is to provide an acoustic surface wave filter which has the transmission characteristic of a multiple filter and is also very simple to manufacture.

According to a first aspect of the invention, there is provided an acoustic surface wave filter comprising a member stimulable to surface oscillation, first means associated with said member for converting electrical energy into mechanical energy, second means associated with said member for converting mechanical energy into electrical energy and a plurality of disturbance locations on a surface of said member in the form of a line grating with spacings between adjacent lines of said grating of varying size in the longitudinal direction of said lines, at least over part of said grating.

According to a second aspect of the invention, there is provided an acoustic surface wave filter comprising at least one member which can be stimulated to surface oscillations and is made at least partly of piezoelectric material, disturbance locations for surface waves on the surface on at least one side of said member and means for converting electrical energy into mechanical energy and vice versa, at least some of the disturbance locations being combined into a resonator in the form of a ruled grating and the average distance between the disturbance locations in the resonator being equal to half the wave-length of the surface waves or an integral multiple thereof, characterised in that the distance between successive grating lines or between opposite portions of the lines, at least in one part of the resonator, varies in the longitudinal direction of said grating lines.

BRIEF DESCRIPTION OF THE DRAWINGS

The invention will now be described in greater detail, by way of example, with reference to the drawings, in which:

FIG. 1 is a diagrammatic view of a known acoustic surface wave filter;

FIG. 2 is a graphical representation of a typical characteristic of the filter of FIG. 1;

FIG. 3 is a graphical representation similar to FIG. 2 but showing a desired characteristic of an acoustic surface wave filter;

FIG. 4 is a diagrammatic view of one embodiment of acoustic surface wave filter in accordance with the invention;

FIG. 5 is a diagrammatic indication for explaining certain embodiments of the invention;

FIG. 6 is a diagrammatic representation of a form of the lines of the grating in accordance with a filter embodiment, and FIG. 7 is a diagrammatic view of a still further embodiment of the invention.

DESCRIPTION OF THE PREFERRED EMBODIMENTS

FIG. 1 shows diagrammatically a known acoustic surface wave filter which can have good flank steepness and is suitable for making wide variations in the intensity of the proportion of oscillations transmitted by the filter. To this end, at least some of the disturbance locations are combined into a resonator in the form of a ruled or line grating and the average distance between disturbance locations is made equal to half the wave-length of the surface waves or to an integral multiple thereof.

As a result of the combined effect of many weak reflections on the grating lines, a standing wave distribution builds up for frequencies at which the distance between adjacent lines of the grating is λ/2 or an integral multiple thereof.

At the filter input, for example, via a short interdigital line, the filter is stimulated with a constant a.c. voltage and at its output, for example via another interdigital line, the filter delivers a voltage U which varies as shown by the resonance curve in FIG. 2. In this curve, $f$ is the frequency and $f_o = c/2l$ is the resonance frequency, with $l$ being the distance between the centres of any two grating lines and $c$ being the propagation speed of the surface waves.

A complete ruled grating, therefore, has the properties of an individual resonator.

To obtain a filter having a pass-band as shown in FIG. 3, it is usual to couple a number of resonators together.

An object of the invention is to provide an acoustic surface wave filter which has the transmission characteristic of a multiple filter.

Basically, the invention proposes that the distance between successive grating lines or between opposite portions of the lines, at least in one part of the resonator, varies in the longitudinal direction of the grating lines.

Some preferred embodiments of the invention will now be described in detail with reference to FIGS. 4–6.

In a device as shown in FIG. 4, the grating lines of the resonator are formed on a circular strip. Since the straight lines are closer together near the inner boundary circle (radius $R_i$) than at the outside (radius $R_a$), the resonance frequency is greater at the inside ($f_i = c/2l_i$) than at the outside ($f_a = c/2l_a$). It can be proved by geometry that the relative bandwidth $\mu$ of a filter of this kind has the following value:

$$\nu = 2 \frac{R_a - R_i}{R_a + R_i}$$

The number of grating lines must be made so large that the reciprocal of the quality Q of a partial resonator bounded by any two successive grating lines, i.e. the attenuation thereof, is small compared with the relative bandwidth $\nu$ of the total filter, i.e.

$$\frac{1}{Q} \ll \nu$$

In most cases this can be done by making $$\frac{1}{Q} \leq \frac{1\nu}{10}.$$

If the filters do not have an unduly small relative bandwidth, i.e. in the percentage region, the same effect can be obtained by selecting the number of grating lines.

FIG. 4 gives only one, simple, example. In more complicated filters it may happen that the grating lines have to be curved instead of straight. The reason is as follows. If, for example, the transmission characteristic in the transmission region has to be made as flat as possible or the transmission curve (FIG. 3) has to have a Tschebyscheff shape, the contents of the individual partial resonators, i.e. the resonators bounded by successive grating lines or the corresponding parts S of the total strip (FIG. 5) situated between $R_i + S$ and $R_i + S + 1$, must not be uniformly distributed within the filter bandwidth. Frequently the zero positions of the polynomial describing the transmission are more closely packed at the edges than at the centre of the transmission region. A filter with these properties, therefore, would consist of a series of bent grating lines, as shown in FIG. 6. If this structure is continued with straight parallel lines, parts of the filter can be preferred so as to produce additional humps in the transmission curve.

Advantageously the entire filter system is applied by photolithographic methods on to a substrate of piezoelectric material, preferable crystalline quartz. Advantageously, the required input and output transducers, for example in the form of interdigital coupling-in and coupling-out lines or other resonators, can be formed at the same time. The transducers can also be represented as parts of a ruled-grating resonator, as shown in FIG. 4, in which case the individual resonators must be separated by regions having a different wave impedance from that in the adjacent resonators. Advantageously also, the piezoelectric substrate is used as a support for other components, so as to obtain a compact surface wave filter having small external dimensions. The other components may be for example matching amplifiers at the filter input and/or output, comprising at least one transistor (FIG. 7). If the matching amplifiers are disposed, for example, in chip form, directly on the substrate, the leads to the transducers can be short, thus eliminating interfering capacitances, which restrict the band width.

It will be understood that the aforementioned description of the present invention is susceptible to various modifications, changes and adaptations.

What is claimed is:

1. An acoustic surface wave filter comprising at least one member which can be stimulated to surface oscillations and is made at least partly of piezoelectric material, disturbance locations for surface waves on the surface on at least one side of the said member and means, associated with said member, for converting electrical energy into mechanical energy and vice versa, at least some of the disturbance locations being combined into a resonator in the form of a line grating and the average distance between the disturbance locations in the resonator being equal to half the wavelength of the surface waves or an integral multiple thereof, characterised in that the distance between successive grating lines or between opposite portions of the lines, at least in one part of the resonator, varies in the longitudinal direction of said grating lines.

2. A surface wave filter as defined in claim 1, wherein successive grating lines or opposite portions of said lines, at least in one part of the resonator, are disposed at an angle to one another.

3. A surface wave filter as defined in claim 1, wherein at least some of said grating lines are curved.

4. A surface wave filter as defined in claim 1, wherein at least some of said grating lines contain a curved region.

5. A surface wave filter as defined in claim 1, wherein the length of at least some of the grating lines is limited by a curve, preferably an arc of a circle.

6. A surface wave filter as defined in claim 5, wherein said curve comprises an arc of a circle.

7. A surface wave filter, as defined in claim 1, wherein the resonator is coupled to other disturbance locations and a region having a different wave impedance from the resonator and the disturbance location region is disposed between the resonator and the disturbance locations which are to be coupled.

8. A surface wave filter, as defined in claim 1, wherein a matching amplifier is provided at the filter input and/or output and contains at least one transistor, the matching amplifier being disposed in chip form on the substrate.

9. An acoustic surface wave filter comprising a member stimulable to surface oscillation, first means associated with said member for converting electrical energy into mechanical energy, second means associated with said member for converting mechanical energy into electrical energy and a plurality of disturbance locations on a surface of said member in the form of a line grating with spacings between adjacent lines of said grating of varying size in the longitudinal direction of said lines, at least over part of the length of said lines.

* * * * *